US010222407B2

(12) United States Patent
Steiner

(10) Patent No.: US 10,222,407 B2
(45) Date of Patent: Mar. 5, 2019

(54) SENSOR ARRANGEMENT WITH A CAPACITIVE SENSOR AND METHOD FOR GENERATING AN AMPLIFIED SENSOR SIGNAL WITH A CAPACITIVE SENSOR

(71) Applicant: ams AG, Unterpremstätten (AT)

(72) Inventor: Matthias Steiner, Seiersberg (AT)

(73) Assignee: ams AG, Unterpremstaetten (AT)

( * ) Notice: Subject to any disclaimer, the term of this patent is extended or adjusted under 35 U.S.C. 154(b) by 484 days.

(21) Appl. No.: 14/566,664

(22) Filed: Dec. 10, 2014

(65) Prior Publication Data

US 2015/0137834 A1 May 21, 2015

Related U.S. Application Data

(63) Continuation of application No. PCT/EP2013/059732, filed on May 10, 2013.

(30) Foreign Application Priority Data

Jun. 12, 2012 (EP) .................................. 12171634

(51) Int. Cl.
*G01R 1/30* (2006.01)
*G01R 27/26* (2006.01)
(Continued)

(52) U.S. Cl.
CPC .......... *G01R 27/2605* (2013.01); *G01R 1/30* (2013.01); *H03F 1/34* (2013.01); *H04R 19/005* (2013.01); *H04R 19/04* (2013.01)

(58) Field of Classification Search
CPC ......... G01R 27/2605; G01R 1/30; H03F 1/34; H03F 3/04; H03F 3/181; H03F 3/183187;
(Continued)

(56) References Cited

U.S. PATENT DOCUMENTS 3,641,431 A 2/1972 Pigage et al.
3,643,173 A * 2/1972 Whitten ............. H03H 11/1204
330/107

(Continued)

FOREIGN PATENT DOCUMENTS

EP 2237414 A2 10/2010
EP 2317645 A1 5/2011
(Continued)

OTHER PUBLICATIONS

English Machine Translation of Yakabe e al. JP 2004-212212 (as cited in IDS filed Dec. 10, 2014).*
English machine translation of Kimura et al. JP 2012070120.*
Citakovic, J. et al.: "A compact CMOS MEMS microphone with 66dB SNR"; IEEE; IEEE International Solid State Circuits Conference, Feb. 8-12, 2009; pp. 350-351, 351a; ISBN: 978-1-4244-3458-9.
(Continued)

*Primary Examiner* — Lee Rodak
(74) *Attorney, Agent, or Firm* — Fish & Richardson P.C.

(57) ABSTRACT

A sensor arrangement (10) comprises an amplifier (11) having a signal input (12) to receive an input signal (SIN) and a signal output (13) to provide an amplified sensor signal (SOUT) that is an inverted signal with respect to the input signal (SIN). Furthermore, the sensor arrangement (10) comprises a feedback path connecting the signal output (13) to the signal input (12), wherein the feedback path comprises a series connection of a capacitive sensor (14) and a feedback capacitor (15). A voltage source arrangement (19) of the sensor arrangement (10) is connected to a feedback node (18) between the capacitive sensor (14) and the feedback capacitor (15).

13 Claims, 5 Drawing Sheets

(51) Int. Cl.
*H03F 1/34* (2006.01)
*H04R 19/04* (2006.01)
*H04R 19/00* (2006.01)

(58) Field of Classification Search
CPC ............ H03F 3/45475; H03F 2200/03; H03F 2200/213; H03F 2200/555; H03F 2200/261; H03F 2200/42; H03F 2200/111; H03F 2200/129; H03F 2200/135; H03F 2200/144; H03F 2200/18; H03F 2200/222; H03F 2200/36; H03F 2200/378; H03F 2200/405; H03F 2200/408; H03F 2200/411; H03F 1/301; H04R 19/005; H04R 19/04; H04R 19/016; H04R 3/00; H04R 3/007; H04R 3/06; H04R 3/04; H04R 2201/003; H04R 29/004; H04R 2499/11; H04R 2410/00
See application file for complete search history.

(56) References Cited

U.S. PATENT DOCUMENTS

| | | | |
|---|---|---|---|
| 3,939,468 A | 2/1976 | Mastin | |
| 2005/0040833 A1* | 2/2005 | Yakabe | H04R 29/004 324/686 |
| 2005/0151589 A1* | 7/2005 | Fallesen | H03F 1/30 330/259 |
| 2010/0246859 A1* | 9/2010 | David | H02M 3/07 381/120 |
| 2012/0121106 A1 | 5/2012 | Henriksen | |
| 2013/0051582 A1* | 2/2013 | Kropfitsch | H03F 1/56 381/111 |
| 2013/0266156 A1* | 10/2013 | Frohlich | H03F 1/34 381/120 |
| 2016/0352294 A1* | 12/2016 | Nicollini | H03F 3/45076 |

FOREIGN PATENT DOCUMENTS

| | | | |
|---|---|---|---|
| JP | 2004-212212 A | | 7/2004 |
| JP | 2012070120 | * | 4/2012 |
| WO | 00/02110 A2 | | 1/2000 |
| WO | WO-00/02110 A2 | | 1/2000 |
| WO | 2006/0130828 A3 | | 12/2006 |
| WO | WO-2006/0130828 A2 | | 12/2006 |
| WO | WO 2012/039074 | * | 3/2012 |

OTHER PUBLICATIONS

Helistoe, Panu: "Microsensing 2008: Micromechanical microphone"; VTT Technical Research Centre of Finnland, Feb. 13, 2008.
Hsu, Yu-Chun et al.: "An optimal design of high performance interface circuit with acoustic transducer model"; IEEE; IEEE Asian Solid State Circuits Conference; Nov. 12-14, 2007; pp. 280-283; E-ISBN:978-1-4244-1360-7.
Hua, Siliang et al.: "A novel preamplifier for MEMS microphone"; IEEE; IEEE 8th International Conference on ASIC; Oct. 20-23, 2009, pp. 636-638; E-ISBN: 978-1-4244-3870-9.
Jawed, S.A. et al.: "A 828f.μW 1.8V 80dB dynamic-range readout interface for a MEMS capacitive microphone"; IEEE; 34th European Solid State Circuits Conference, Sep. 15-19, 2008; pp. 442-445; E-ISBN: 978-1-4244-2362-0.
Jawed, S.A. et al.: "A low-power interface for the readout and motion-control of a MEMS capacitive sensor"; IEEE; 10th IEEE International Workshop on Advanced Motion Control, Mar. 26-28, 2008; pp. 122-125; E-ISBN: 978-1-4244-1703-2.
Jawed, S.A. et al.: "A multifunction low-power preamplifier for MEMS capacitive microphones"; IEEE; ESSCIRC, Sep. 14-18, 2009; pp. 292-295.
Jawed, S.A. et al.: "A switched capacitor interface for a capacitive microphone"; IEEE; Reasearch in Microelectronics and Electronics 2006; pp. 385-388; ISBN: 1-4244-0157-7.
Peng, Sheng-Yu et al.: "A charge-based low-power high-SNR capacitive sensing interface circuit"; IEEE; IEEE Transactions on Circuits and Systems I, Aug. 2008; vol. 55, Issue 7, pp. 1863-1872; ISSN: 1549-8328.
Peng, Sheng-Yu: "A Floating-gate based low-power capacitive sensing interface circuit"; IEEE; IEEE Custom Integrated Circuits Conference, Sep. 10-13, 2006; pp. 257-260; E-ISBN: 1-4244-0076-7.
Posch, Christoph et al.: "A two-stage capacitive feedback differencing amplifier for temporal contrast IR sensors"; IEEE; 14th IEEE International Conference on Electronics, Circuits and Systems, Dec. 11-14, 2007; pp. 1071-1074; E-ISBN: 978-1-4244-1378-2.
Tartagni, M. et al.: "A fingerprint sensor based on the feedback capacitive sensing scheme"; IEEE; IEEE Journal of Solid State Circuits, Jan. 1998; vol. 33, Issue 1, pp. 133-142; ISSN: 0018-9200.
Yusof, Norliana Binti et al.: "Capacitive interfacing for MEMS humidity and accelerometer sensors"; IEEE; 2009 International Conference for Technical Postgraduates, Dec. 14-15, 2009; p. 1-5; E-ISBN; 978-1-4244-5224-8.

* cited by examiner

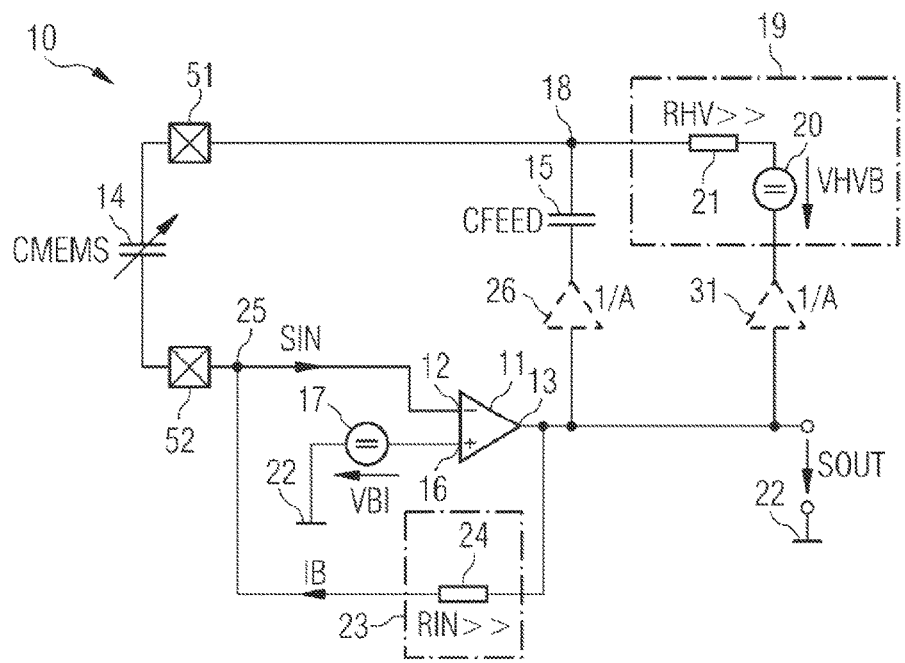
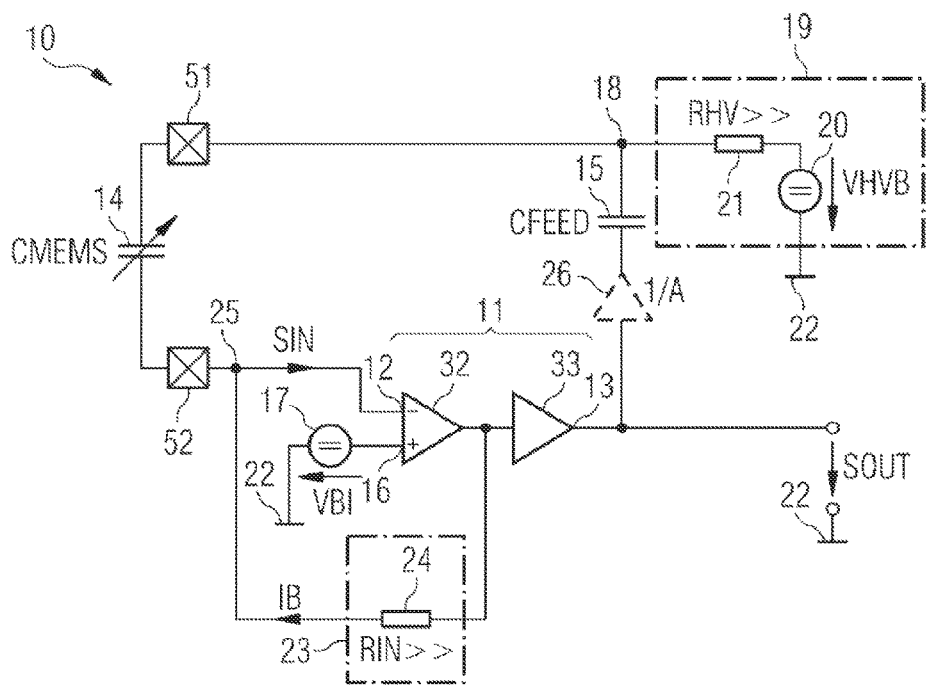

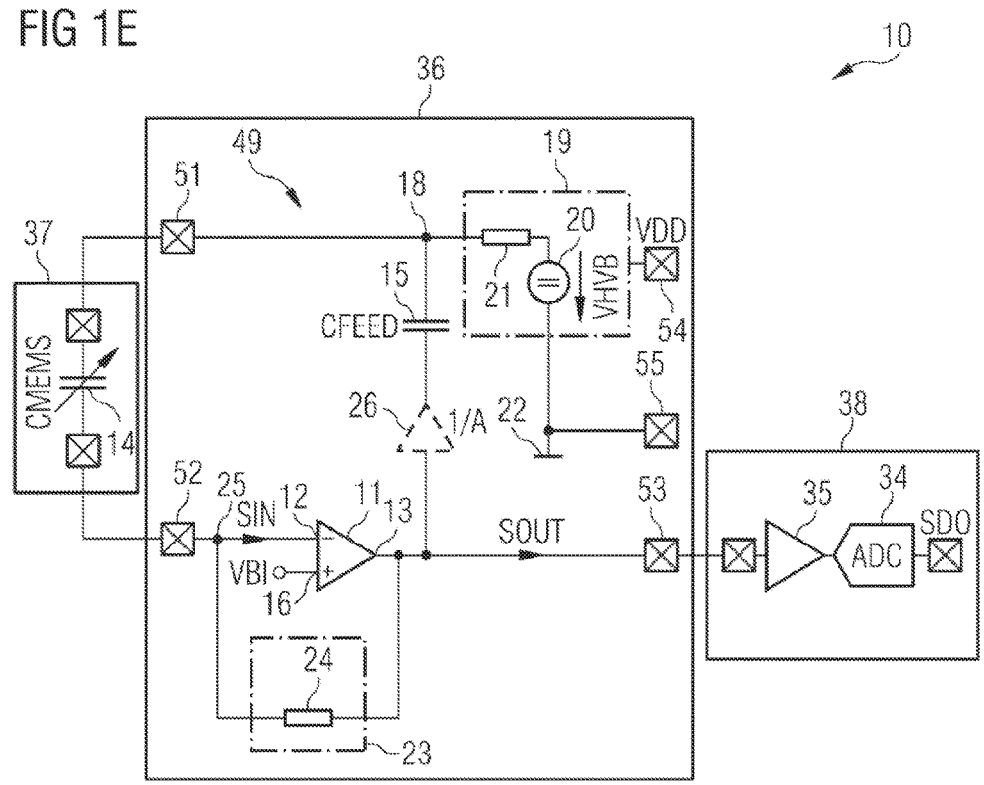

SENSOR ARRANGEMENT WITH A CAPACITIVE SENSOR AND METHOD FOR GENERATING AN AMPLIFIED SENSOR SIGNAL WITH A CAPACITIVE SENSOR

CROSS-REFERENCE TO RELATED APPLICATION

This application is a continuation application of PCT/EP2013/059732, filed on May 10, 2013, which is hereby incorporated by reference in its entirety for all purposes.

FIELD OF THE INVENTION

The invention refers to a sensor arrangement and to a method for providing an amplified sensor signal.

BACKGROUND OF THE INVENTION

A sensor arrangement typically comprises a sensor. The sensor can be of the capacitive type. The quantity that is to be measured changes the capacitance value of the capacitive sensor. The sensor arrangement is foreseen for generating an amplified sensor signal that depends on the capacitance value of the capacitive sensor.

An example for the capacitive sensor is a microphone. The microphone can be realized as a micromechanical microphone.

Publication "A 828 µW 1.8V 80 dB Dynamic-Range Readout Interface for a MEMS Capacitive Microphone", S. A. Jawed et al., 34th European Solid-State Circuits Conference, Sep. 15 to 19, 2008, ESSCIRC 2008 describes a circuit comprising a MEMS microphone and a microphone electrical interface. The microphone electrical interface comprises a charge pump and a preamplifier. An output of the charge pump is coupled via the MEMS microphone to an input of the preamplifier. The circuit shows parasitic capacitors which result in signal attenuation.

SUMMARY OF THE INVENTION

In one embodiment, a sensor arrangement comprises an amplifier having a signal input and a signal output. Moreover, the sensor arrangement comprises a series connection of a capacitive sensor and a feedback capacitor. The series connection of the capacitive sensor and the feedback capacitor is comprised by a feedback path that connects the signal output to the signal input. The sensor arrangement comprises a voltage source arrangement that is connected to a feedback node between the capacitive sensor and the feedback capacitor. An input signal is provided to the signal input. An amplified sensor signal is provided by the amplifier at the signal output and is inverted with respect to the input signal.

For example, the feedback path is adapted to provide a feedback signal from the signal output to the signal input. The capacitive sensor may be directly connected between the feedback node and the signal input of the amplifier.

In one embodiment, the capacitive sensor may be directly connected to the signal input of the amplifier. Furthermore, the capacitive sensor may be directly connected to the feedback capacitor via the feedback node. Moreover, the capacitive sensor may be directly connected to the voltage source arrangement via the feedback node.

A change of the capacitance value of the capacitive sensor results in a change of the input signal and, consequently, also in a change of the amplified sensor signal with high efficiency. The number of components for the realization of the sensor arrangement is low.

In one embodiment, the feedback node between the capacitive sensor and the feedback capacitor may be biased to a high DC voltage. The voltage source arrangement may provide a sensor biasing voltage to the capacitive sensor which has the effect that a high voltage is applied across the capacitive sensor.

In one embodiment, the sensor arrangement performs a DC measurement, in particular a DC-only measurement, with the capacitive sensor. In other words, no AC voltage is applied to the capacitive sensor. Furthermore, no signal current may flow through the capacitive sensor, but only a charging current into the capacitive sensor. The charging current may flow at the start of operation of the sensor arrangement. Thus, no signal current may flow except for startup charging and/or for compensating second order effects like leakage currents.

In one embodiment, the sensor arrangement performs a DC measurement, in particular a DC-only measurement, of the capacitance value of the capacitive sensor. Thus, the charge Q on an electrode of the capacitive sensor may be constant and a change of the capacitance C of the capacitive sensor may result in a change of the voltage V that can tapped between the two electrodes of the capacitive sensor according to the equation $V=Q/C$. Thus, a AC current or a AC voltage may not be provided to the capacitive sensor. The sensor arrangement may perform a DC measurement of the impedance of the capacitive sensor and not an AC measurement.

In one embodiment, "inverted" means that the amplified sensor signal increases, if the input signal falls, and the amplified sensor signal is reduced, if the input signal increases.

In one embodiment, the capacitive sensor is realized as a microphone.

In one embodiment, the capacitance value of the feedback capacitor is larger than the capacitance value of the capacitive sensor. The capacitance value of the feedback capacitor is constant.

In one embodiment, the voltage source arrangement charges the capacitive sensor such that a change of the capacitance value of the capacitive sensor can be measured. Furthermore, the voltage source arrangement additionally charges the feedback capacitor.

In one embodiment, the voltage source arrangement is arranged between the feedback node and a reference potential terminal.

In an alternative embodiment, the voltage source arrangement couples the signal output to the feedback node. Thus, an additional feed-forward path couples the signal output to the capacitive sensor.

In one embodiment, the sensor arrangement comprises an attenuator coupling the signal output to the feedback capacitor. The attenuator is used for gain control.

In one embodiment, the sensor arrangement comprises a further capacitor with an electrode coupled to the feedback node. A further electrode of the further capacitor is coupled to a further signal input of the amplifier or to a reference potential terminal.

In one embodiment, the amplifier comprises an input stage having a transistor. The signal input is connected to a control terminal of the transistor. The transistor is realized as a field-effect transistor.

In one embodiment, the amplifier that comprises the input stage having the field-effect transistor has a high input impedance. The input impedance of the amplifier is realized as a gate capacitance of the field-effect transistor. The amplified sensor signal is capacitively coupled by the feedback capacitor and the capacitive sensor to the gate capacitor of the field-effect transistor of the input stage. The voltage source arrangement achieves a biasing of the feedback node between the capacitive sensor and the feedback capacitor to a high DC voltage. Since a change of a capacitance value of the capacitive sensor results in a change of the voltage across the capacitive sensor and due to the high impedance of the input stage of the amplifier, a change of the voltage across the capacitive sensor is not reduced by a current flow through the signal input of the amplifier.

In one embodiment, the capacitance value CMEMS of the capacitive sensor is determined using DC signals. Since the amplifier aims at keeping a voltage difference between the two inputs of the amplifier constant or zero, the amplifier changes the amplified sensor signal such that a voltage value of the amplified sensor signal is proportional to 1/CMEMS. Thus, the capacitance of the capacitive sensor can be measured with high sensitivity.

In one embodiment, the sensor arrangement comprises a biasing circuit which couples the signal output to the signal input. The biasing circuit is arranged parallel to the series circuit of the capacitive sensor and the feedback capacitor. The biasing circuit generates a biasing current. The biasing current is an attenuated signal of the amplified sensor signal. The biasing current is inverted with respect to the input signal. The biasing circuit may provide a low-pass characteristic. The biasing circuit may comprise a biasing amplifier having an input coupled to the signal output and an output coupled to the signal input. The biasing amplifier may be realized as a transconductance amplifier. The biasing circuit may comprise an anti-parallel circuit of diodes coupling the output of the biasing amplifier to the signal input.

In one embodiment, the low-pass characteristic provided by the biasing circuit has a corner frequency. The corner frequency may be lower than the lowest frequency of a signal band of the input signal. Thus, the corner frequency may be lower than the lowest frequency of a signal band of the amplified sensor signal.

In one embodiment, the biasing circuit provides a bias to the signal input of the amplifier. The amplifier is kept in a stable operating point by the bias. If, for example, the amplified sensor signal at the signal output obtains a value near the upper voltage limit that can be provided by the amplifier, the biasing circuit provides a signal to the signal input of the amplifier that increases the input signal. Since the amplified sensor signal is an inverted signal with respect to the input signal, the increase of the input signal results in a decrease of the amplified sensor signal. Thus, the biasing circuit has the effect that the amplified sensor signal does not rise to the upper voltage value or also does not decrease to the lower voltage value that can be provided by the amplifier. Since the amplified sensor signal does not stay at the upper or lower voltage value generated by the amplifier, the information gained by the capacitive sensor is continuously present in the amplified sensor signal.

In one embodiment, the amplifier and the biasing circuit form a loop. The low-pass characteristic of the biasing circuit may be configured such that the amplified sensor signal represents the information gained by the capacitive sensor and said information is not reduced by the loop.

In one embodiment, a method for generating an amplified sensor signal comprises providing an input signal by a capacitive sensor to a signal input of an amplifier and generating an amplified sensor signal by the amplifier. The amplified sensor signal is an inverted signal with respect to the input signal. The amplified sensor signal is provided at a signal output of the amplifier. A feedback is generated from the signal output to the signal input with a series connection of the capacitive sensor and a feedback capacitor. For example, the series connection couples the signal output to the signal input. Moreover, the capacitive sensor is charged by a voltage source arrangement that is connected to a feedback node between the capacitive sensor and the feedback capacitor. The capacitive sensor may be directly connected between the feedback node and the signal input of the amplifier.

Further embodiments of the method become apparent from the embodiments of the sensor arrangement described above.

It is an advantage that a cost effective circuit with a small number of components is sufficient for the generation of the amplified sensor signal depending on a capacitance change of the capacitive sensor.

BRIEF DESCRIPTION OF THE DRAWINGS

The following description of figures of exemplary embodiments may further illustrate and explain aspects of the invention. Devices and circuit blocks with the same structure and the same effect, respectively, appear with equivalent reference symbols. In so far as devices or circuit blocks correspond to one another in terms of their function in different figures, the description thereof is not repeated for each of the following figures.

FIGS. 1A to 1E show exemplary embodiments of a sensor arrangement;

DETAILED DESCRIPTION

Figure 1A:
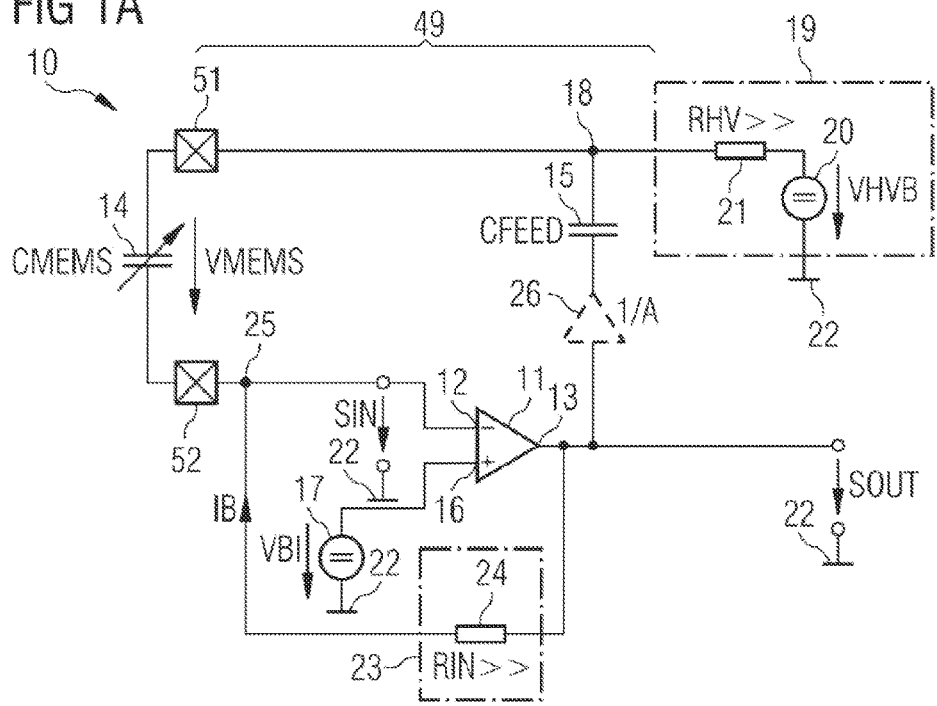

FIG. 1A shows an exemplary embodiment of a sensor arrangement 10. The sensor arrangement 10 comprises an amplifier 11 having a signal input 12 and a signal output 13. Moreover, the sensor arrangement 10 comprises a feedback path with a capacitive sensor 14 and a feedback capacitor 15. The capacitive sensor 14 and the feedback capacitor 15 are arranged in series between the signal output 13 and the signal input 12. The capacitive sensor 14 is directly connected to the signal input 12, whereas the feedback capacitor 15 is connected to the signal output 13. The capacitive sensor 14 may be realized as a capacitive microphone. For instance, the capacitive sensor 14 is implemented as a micro-electro-mechanical-system microphone, abbreviated to MEMS microphone. The capacitive sensor 14 typically has a capacitance value CMEMS that is variable and obtains a very small nominal value. The feedback capacitor 15 has a capacitance value CFEED that is constant. Furthermore, the amplifier 11 comprises a further signal input 16 that is connected to a reference voltage source 17. The signal input 12 is implemented as an inverting input of the amplifier 11. The further signal input 16 is realized as a non-inverting input of the amplifier 11.

The capacitive sensor 14 is connected, optionally directly connected to the feedback capacitor 15 via a feedback node 18. In particular, terminals 51 and 52, corresponding to the feedback node 18 respectively the inverting amplifier input 12, form a high-ohmic connection for the capacitive sensor 14. The sensor arrangement 10 comprises a voltage source arrangement 19 which is connected on its output side to the feedback node 18. The voltage source arrangement 19 comprises a voltage source 20. The voltage source 20 may be implemented as a charge pump. The voltage source 20 is arranged between the feedback node 18 and a reference potential terminal 22. The voltage source 20 is connected to the feedback node 18 via a resistive circuit of the voltage source arrangement 19. The series connection of the resistive circuit 21 and the voltage source 20 couples the feedback node 18 to the reference potential terminal 22. The resistive circuit 21 may be implemented as a high resistive circuit element having a high resistance value. The resistive circuit 21 provides a current depending on a voltage difference between the terminals of the resistive circuit 21 in a non-linear fashion. The resistive circuit 21 for instance comprises an anti-parallel circuit of diodes, a channel of a metal-oxide-semiconductor field-effect transistor or an on-chip resistor. Alternatively, the resistive circuit 21 represents the parasitic resistance of the voltage source arrangement 19.

The sensor arrangement 10 comprises an attenuator 26 that is arranged in series to the series circuit of the capacitive sensor 14 and the feedback capacitor 15. The attenuator 26 couples the signal output 13 to the feedback capacitor 15. The attenuator 26 may be implemented as a capacitive voltage divider. Alternatively, the attenuator 26 can be realized as a resistive voltage divider, or left out completely.

Figure 2A:
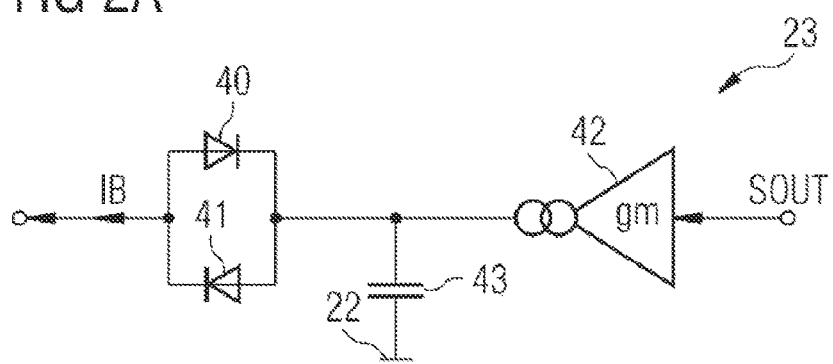
FIGS. 2A and 2B show exemplary embodiments of details of a sensor arrangement.

Moreover, the sensor arrangement 10 comprises a biasing circuit 23 which couples the signal output 13 to the signal input 12. The biasing circuit 23 comprises a resistive biasing circuitry 24. The biasing circuit 23 can be realized as a circuit network. The biasing circuit 23 may comprise an anti-parallel circuit of diodes as shown in FIG. 2A, a channel of a metal-oxide-semiconductor field-effect transistor or a resistor. The biasing circuit 23 is coupled on its output side to an input node 25 that is located between the capacitive sensor 14 and the signal input 12.

An input signal SIN is provided to the signal input 12. An amplified sensor signal SOUT is provided at the signal output 13. The amplified sensor signal SOUT has the form of a voltage. The amplified sensor signal SOUT is applied to the biasing circuit 23. The amplified sensor signal SOUT is provided to one terminal of the resistive biasing circuitry 24. The biasing circuit 23 generates a biasing current IB that is provided to the input node 25. The biasing current IB depends on a voltage difference between the terminals of the biasing circuit 23 in a non-linear fashion. The biasing current IB is generated depending on the amplified sensor signal SOUT by the biasing circuit 23. Since the input signal SIN is applied to the signal input 12 that is the inverting input of the amplifier 11, the amplified sensor signal SOUT is an inverted signal in respect to the input signal SIN.

The amplified sensor signal SOUT is applied to the series connection of the capacitive sensor 14 and the feedback capacitor 15. Thus, the amplified sensor signal SOUT is capacitively coupled respectively fed back to the signal input 12 via the series connection of the capacitive sensor 14 and of the feedback capacitor 15. The voltage source 20 generates a source voltage VHVB that is applied to the feedback node 18. The source voltage VHVB acts as a sensor biasing voltage. The source voltage VHVB has the effect that a high voltage is supplied across the capacitive sensor 14. The quantity to be measured changes the capacitance value of the capacitive sensor 14. Due to the high voltage which drops between the two electrodes of the capacitive sensor 14, a current, in particular a charging current, flows from the capacitive sensor 14 to the input node 25 in case of a capacitance change.

The reference voltage source 17 provides a reference voltage VBI that is supplied to the further input 16. The capacitive sensor 14 is connected in series with the feedback capacitor 15 to form the feedback path of an integrator-like circuit. The amplifier 11 is regulating the voltage at the feedback node 18 such that the voltage value of the input signal SIN is kept constant, making the amplified sensor signal SOUT proportional to the inverse of the capacitance value CMEMS of the capacitive sensor 14 in the frequency range of interest. The amplifier 11 comprises a differential MOSFET input stage. Alternatively, the amplifier 11 comprises a single MOSFET input stage as illustrated for example in FIG. 2B.

The sensor arrangement 10 comprises a series connection of the capacitive sensor 14 and the feedback capacitor 15 with well defined high voltage biasing in the feedback path of an integrator-like circuit. The sensor arrangement 10 realizes a continuous time sensor interface. The sensor arrangement 10 uses the capacitive sensor 14 in the continuous time feedback path of an integrator-like circuit. The feedback is built by a high voltage biased series connection of the capacitive sensor 14 and the feedback capacitor 15. The integrator-like circuit is used to process a signal from the capacitive, for instance MEMS microphone, sensor 14. The amplified sensor signal SOUT is present on the high voltage side of the capacitive sensor 14 by active regulation. There is no signal current flowing in the capacitive sensor 14.

The capacitive sensor 14 may be connected to an interface circuitry 49 via two pads 51, 52. The interface circuitry 49 comprises the amplifier 11, the feedback capacitor 15, the reference voltage source 17, the voltage source arrangement 19 and the biasing circuit 23. The capacitive sensor 14, the feedback capacitor 14 and the amplifier 11 form the integrator-like circuit which provides its output signal SOUT as a voltage. Typically, the capacitance value CFEED of the further capacitor 15 is larger than the capacitance value CMEMS of the capacitive sensor 14, thus CFEED>CMEMS.

In contrast to a conventional integrator circuit, the interface circuitry 49 does not change its output signal SOUT by charging a current into a feedback capacitor. Instead, the feedback node 18 between the two series capacitors 14, 15 is biased to a high DC voltage, and it is the change in the capacitance value CMEMS of the capacitive sensor 14 which will result in a change of the voltage VMEMS across the capacitive sensor 14 according to VMEMS=Q/CMEMS, thereby changing the amplified sensor signal SOUT. The sensor biasing voltage is supplied through the high impedance elements 21, 24 in such a way that the charge Q in the capacitive sensor 14 and the further capacitor 15 is constant in the frequency range of interest, making the voltage value of the amplified sensor signal SOUT proportional to 1/CMEMS. The resistive circuit 21 having the resistance value RHV and the resistive biasing circuitry 24 with the resistance value RIN are designed considering their impact on the noise and total harmonic distortion performance, abbreviated to THD. The sensor arrangement 10 is designed as continuous time circuit, wherein no current flows into the capacitive sensor 14 with the exception of a charge that flows once at the start of operation and/or a leakage current for example flowing through the signal input 12 of the amplifier 11. Thus, the sensor arrangement 10 may be free of a switched capacitor circuit.

In an alternative, not shown embodiment, the attenuator 26 is omitted and replaced by a short circuit.

In an alternative embodiment, the capacitive sensor is implemented as an acceleration sensor or a humidity sensor. The capacitive sensor 14 comprises two parallel plates or two interdigitated electrodes.

In an alternative, not shown embodiment, the reference voltage source 17 is omitted. The further signal input 16 is directly connected to the reference potential terminal 22.

Figure 1B:
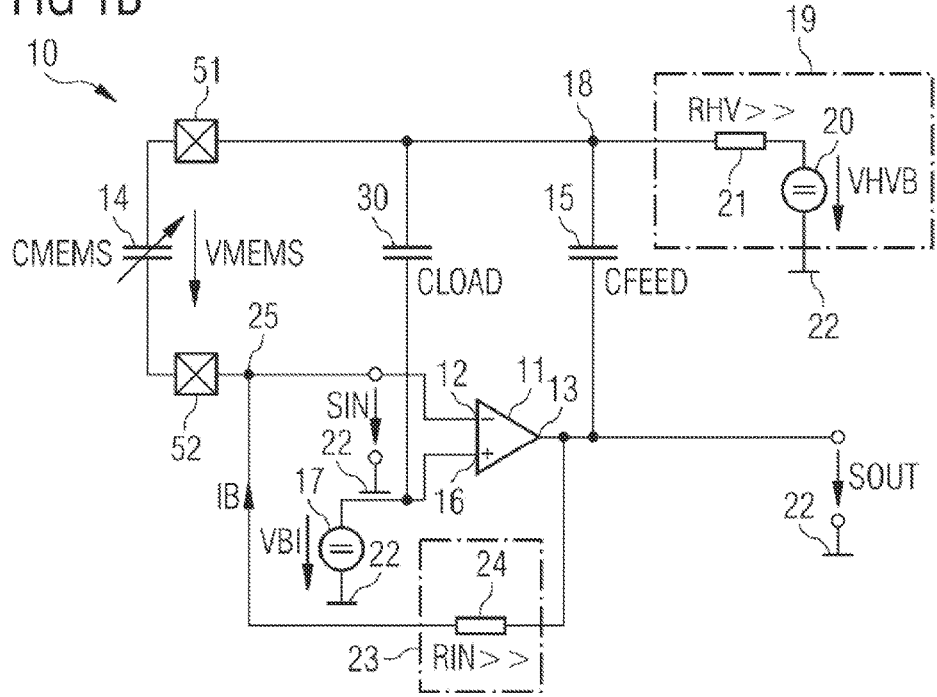

FIG. 1B shows a further exemplary embodiment of a sensor arrangement 10 which is a further development of the sensor arrangement illustrated in FIG. 1A. The sensor arrangement 10 additionally comprises a further capacitor 30. The further capacitor 30 couples the further signal input 16 to the feedback node 18. An electrode of the further capacitor 30 is connected to the feedback node 18. A further electrode of the further capacitor 30 is connected to the further signal input 16.

To have a signal gain A larger than 1, the attenuator having an attenuation of 1/A is inserted into the feedback. As shown in FIG. 1B, the attenuator 26 is implemented as a capacitive divider. The capacitive divider comprises the feedback capacitor 15 and the further capacitor 30. The capacitive divider is formed by the feedback capacitor 15 having the capacitance value CFEED and the further capacitor 30 having the capacitance value CLOAD. The gain from the voltage VMEMS at the capacitive sensor 14 to the amplified sensor signal SOUT can now be adjusted using the equation:

$$SOUT/VMEMS = CFEED/(CFEED+CLOAD),$$

wherein VMEMS is the voltage across the capacitive sensor 14 and SOUT is realized as a voltage. The gain SOUT/VMEMS is defined by the capacitance ratio of the capacitive divider. The ratio depends on the capacitance value CLOAD of the further capacitor 15 at the feedback node 18 and the capacitance value CFEED of the feedback capacitor 15. In contrast to a resistive gain circuit, less supply current is needed.

FIG. 1C shows a further exemplary embodiment of the sensor arrangement 10 which is a further development of the sensor arrangement illustrated in FIG. 1A or FIG. 1B. The voltage source arrangement 19 is arranged between the feedback node 18 and the signal output 13. Thus, the voltage source 20 is coupled to the signal output 13. The sensor arrangement 10 comprises an additional attenuator 31 which is arranged between the voltage source arrangement 19 and the signal output 13. The additional attenuator 31 can be realized as a capacitive or resistive voltage divider. The coupling of the voltage source arrangement 19 between the feedback node 18 and the signal output 13 results in an additional feed-forward path that is parallel to the feed-forward path provided by the feedback capacitor 15. The design of the resistive circuit 21 can be significantly relaxed by using the additional feed-forward path. In the sensor arrangement 10 shown in FIG. 1C, the resistive circuit 21 can be more non-linear in comparison to the resistive circuit 21 implemented in the sensor arrangement 10 shown in FIGS. 1A and 1B. The resistive circuit 21 is designed to obtain a high resistance value RHV in the sensor arrangement 10 shown in FIGS. 1A to 1C.

In FIG. 1C the schematic of FIG. 1A is extended with a feed-forward path from the signal output 13 to the feedback node 18 in such a way that the high biasing voltage generated at the output of the voltage source arrangement 19 is no longer constant but is equal to the sum of the amplified sensor signal SOUT and the source voltage VHVB. The benefit is that the design of the resistive circuit 21 is greatly relaxed in terms of linearity because the resistive circuit 21 no longer sees a signal. The amplified sensor signal SOUT does not drop or drops only in a reduced extent on the voltage source arrangement 19. If the voltage source 19 is a capacitive charge pump, the feed-forward signal can be added by using the amplified sensor signal SOUT as the reference voltage for the first pump stage.

In an alternative, not shown embodiment, the additional attenuator 31 is omitted and replaced by a short circuit.

In an alternative, not shown embodiment, the feedback capacitor 15 and the resistive circuit 21 could be removed such that the signal output 13 is coupled via the voltage source 20 to the feedback node 18. The resistive circuit 21 can be replaced by a short circuit. Thus, the path with the feedback capacitor 15 is eliminated. Theoretically, this is possible, but practically the feedback capacitor 15 and the resistive circuit 21 are still needed to filter the noise generated by the voltage source 20.

FIG. 1D shows an alternative exemplary embodiment of the sensor arrangement 10 which is a further development of the sensor arrangement illustrated in FIGS. 1A to 1C. The amplifier 11 comprises a first stage 32 and an output stage 33. The signal input 12 and the further signal input 16 are connected to the input stage 32. An output of the input stage is coupled to an input of the output stage 33. The output of output stage 33 forms the signal output 13. Thus, the signal output 13 of the output stage 33 is coupled via the series circuit of the capacitive sensor 14 and the feedback capacitor 15 to the signal input 12 of the input stage 32. The biasing circuit 23 is connected to the output of the input stage 32. Thus, the output of the input stage 32 is coupled via the biasing circuit 23 to the signal input 12.

FIG. 1E shows a further exemplary embodiment of the sensor arrangement 10 that is a further development of the sensor arrangement illustrated in FIGS. 1A to 1D. The sensor arrangement 10 additionally comprises an analog-to-digital converter 34 that is coupled on its input side to the signal output 13. The sensor arrangement 10 comprises a buffer 35 that is arranged between the signal output 13 and the analog-to-digital converter 34. The analog-to-digital converter 34 generates a digital amplified sensor signal SDO as a function of the amplified sensor signal SOUT.

The sensor arrangement 10 comprises a first semiconductor body 36. The amplifier 11, the feedback capacitor 15, the voltage source arrangement 19 and the biasing circuit 23 are integrated on the first semiconductor body 36. The first semiconductor body 36 comprises the interface circuitry 49. A second semiconductor body 37 of the sensor arrangement 10 comprises the capacitive sensor 14. A third semiconductor body 38 of the sensor arrangement 10 comprises the analog-to-digital converter 34 and the buffer 35. The second semiconductor body 37 is fabricated by using micromachining. The first and the third semiconductor bodies 36, 38 are fabricated using a complementary metal oxide semiconductor technology, abbreviated to CMOS technology. Alternatively, the first and the third semiconductor bodies 36, 38 are fabricated by a combined bipolar CMOS technology, abbreviated to BICMOS technology.

FIG. 2A shows an exemplary embodiment of the biasing circuit 23 that can be inserted in the sensor arrangement of FIGS. 1A to 1E. The biasing circuit 23 comprises two diodes 40, 41. The anode of the diode 40 is connected to the cathode of the further diode 41. The anode of the further diode 41 is connected to the cathode of the diode 40. The two diodes 40, 41 form an anti-parallel circuit of diodes. The anti-parallel circuit of diodes 40, 41 is connected to the input node 25. Furthermore, the biasing circuit 23 comprises a biasing amplifier 42 which couples the signal output 13 to the anti-parallel circuit of diodes 40, 41. The biasing amplifier 42 is implemented as a transconductance amplifier, abbreviated to OTA. Moreover, the biasing circuit 23 comprises a biasing capacitor 43 which connects the output of the biasing amplifier 42 to the reference potential terminal 22.

The biasing circuit 23 shown in FIG. 2A implements the resistive biasing circuitry 24. Thus, the biasing circuit 23 is designed as a series connection of a slow integrator realized by the low gm OTA 42 and the biasing capacitor 43 and a pair of anti-parallel diodes 40, 41. The amplified sensor signal SOUT is fed into a slow integrator circuit made by the low gm OTA 42 and the biasing capacitor 43. The pair of anti-parallel diodes 40, 41 ensures that the noise at the biasing capacitor 43 is suppressed to the input node 25 and that a current is supplied gradually into the input node 25 with little shot-noise at low currents.

Figure 2B:
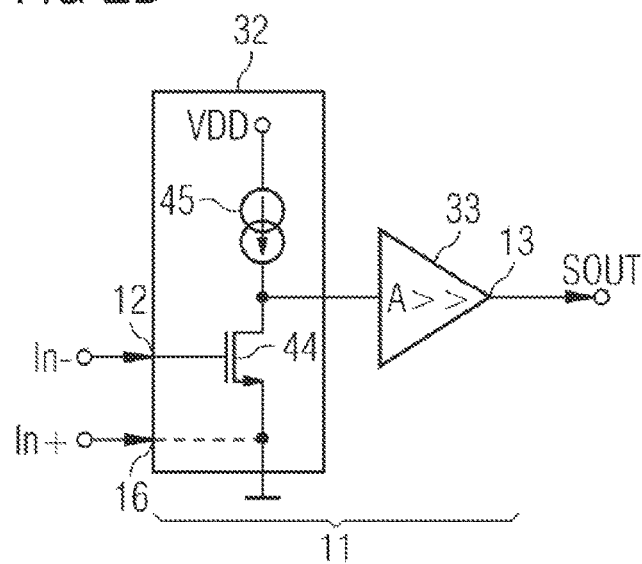

FIG. 2B shows an exemplary embodiment of the amplifier 11 that can be inserted in the sensor arrangement of FIGS. 1A to 1E. The amplifier 11 comprises a transistor 44. The signal input 12 is connected to a control terminal of the transistor 44. The transistor 44 is fabricated as a field-effect transistor. The transistor 44 is implemented as metal-oxide-semiconductor field-effect-transistor, abbreviated to MOSFET. The transistor 44 is realized as an n-channel MOSFET. The transistor 44 is arranged in a source circuit configuration. The amplifier 11 comprises a current source 45 that is connected to a terminal of the transistor 44. A further terminal of the transistor 44 is connected to the reference potential terminal 22. The further signal input 16 is connected to the reference potential terminal 22. Thus, the input stage 32 comprises a transistor 44 and the current source 45. A node between the transistor 44 and the current source 45 is connected to an output of the input stage 32 and is coupled to the signal output 13 via the output stage 33. The amplifier 11 is realized with a single transistor MOSFET input stage in a source circuit configuration. The single MOS transistor 44 in source circuit configuration is used as the input stage, making the amplifier 11 efficient in terms of noise, area and power consumption compared to a conventional differential stage with two transistors.

Figure 3:
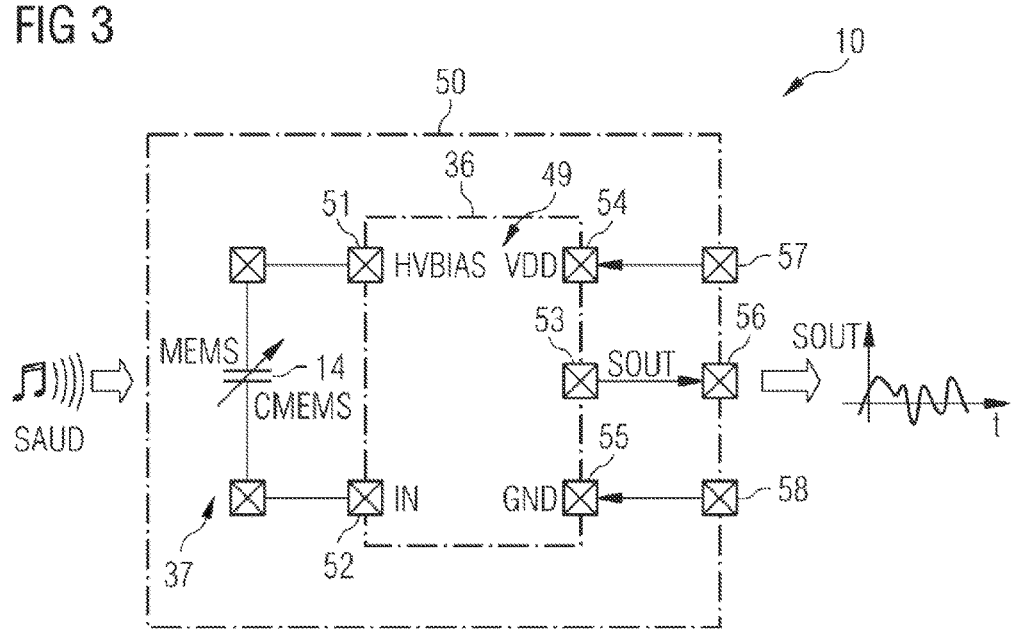
FIG. 3 shows an exemplary embodiment of a microphone component.

FIG. 3 shows an exemplary microphone component 50. The microphone component 50 comprises the capacitive sensor 14 and the interface circuitry 49. The microphone component 50 is comprised by the sensor arrangement 10. The capacitive sensor 14 is realized as a MEMS microphone. The capacitive sensor 14 typically has a very small nominal capacitance. The interface circuitry 49 is realized on the first semiconductor body 36. The interface circuitry 49 comprises the amplifier 11, the biasing circuit 23, the voltage source arrangement 22 and the feedback capacitor 15 which are not shown in FIG. 3. The interface circuitry 49 can also be named as an interface integrated circuit, abbreviated to interface IC. The interface circuitry comprises five pads 51 to 55. A first and a second pad 51, 52 are used for coupling the interface circuitry 49 to the capacitive sensor 14. The amplified sensor signal SOUT is tapped at the third pad 53. The fourth and the fifth pads 54, 55 are foreseen for providing the supply voltage VDD and the reference potential to the reference potential terminal 22 to the interface circuitry 49. Thus, the interface circuitry 49 exactly comprises five pads 51 to 55. The second semiconductor body 37 with the capacitive sensor 14 comprises exactly two pads. The microphone component 50 having the first and the second semiconductor body 36, 37 comprises a first to a third pin 56 to 58. The first pin 56 is connected to the third pad 53. The second pin 57 is connected to the fourth pad 54 and the third pin is connected to the fifth pad 55. The microphone component 50 may comprise exactly three pins 56, 57 and 58.

An audio signal SAUD is provided to the capacitive sensor 14 and results in the amplified sensor signal SOUT in the form of a voltage signal. The interface circuitry 49 and the capacitive sensor 14 realized as a MEMS microphone sensor form the microphone component 50. The microphone component converts the audio signal SAUD that is the sound pressure to the amplified sensors signal SOUT that is an amplified low impedance voltage signal.

The sensor arrangement 10 fulfills the requirements of the capacitive MEMS microphone sensor 14 for the circuit design: The sensor arrangement 10 is suitable for the nominal capacitance of the capacitive sensor 14 that is typically very small, for example Cnom=1pF and for the capacitance change at nominal audio signal pressure that is very low, for example $\Delta C/Cnom=-60$ dB. A high signal-to-noise ratio at a nominal signal is achieved. For example the signal-to-noise ratio is larger than >60 dB, making the total sensor referred noise requirement for example $\Delta Cnoise/Cnom=-120$ dB. A THD of 10% can be achieved for signals up to at least 26 dB of the nominal signal. The first semiconductor body 36 has a small size. The small die size results in a low cost product in a high volume production. The sensor arrangement 10 only requires a low minimum supply voltage VDD and has a low power consumption. The interface circuitry 49 is designed as a sensor front end circuit with an extraordinarily large input impedance and low noise for a continuous time front end amplifier. The interface circuitry 49 does not require switching elements. Since the sensor arrangement 10 does not require switches, kT/C noise is avoided.

Alternatively, the sensor arrangement 10 is implemented without any switch with the exception of at least a switch comprised by the voltage source arrangement 19. The voltage source 20 is realized as a charge pump having switches. The kT/C noise generated by the charge pump is filtered by the resistive circuit 21 and the capacitors connected to the feedback node 18 such as the feedback capacitor 15.

The sensor arrangement 10 may have the following advantages: No signal attenuation/charge loss is caused by parasitic capacitors at the second pad 52 and also inside the capacitive sensor 14, thus a higher signal amplitude can be harvested resulting in a noise advantage and also no bootstrapping for parasitic capacitance attenuation is required. No signal attenuation is caused by parasitic capacitors at the first pad 51, these parasitic capacitors even increase the signal gain. The gain increase can be controlled with the size of the feedback capacitor 15. Since there is no attenuation due to parasitic capacitors, the tendency of the capacitive sensor 14 to stick, named as "pull in", is reduced, because the electric field in the capacitive sensor 14 does not increase with smaller plate distance of the sensor capacitor, especially at high amplitudes. The tendency of the capacitive sensor 14 to stick is lower, since the sensor arrangement 10 ensures a constant field between the plates of the capacitive sensor 14. There might even be room to increase the sensor bias voltage VHVB to increase sensor sensitivity for better signal-to-noise ratio. Since there is no charge loss due to parasitic capacitances, the THD is reduced which would be introduced at large signals by sensor charge change. No gmC filter with large capacitor is required for low frequency high pass filtering.

A voltage at the second pad 52 is accurately regulated, which improves the voltage accuracy across the capacitive sensor 14 and thereby improves the sensor gain accuracy.

There is a constant voltage (no signal) at the signal input 12, significantly relaxing the design of the amplifier 11; no signal amplitude limitation from amplifier input stage 32. There is a constant voltage (no signal) at the signal input 12, which removes any THD impact of dependency of the resistance value RIN of the resistive biasing circuitry 24 on the voltage value of the input signal SIN. The maximum signal amplitude is defined by the output of the amplifier 11 and the design of resistive circuit 21, allowing larger signals than with a limitation from the input of the amplifier 11. Theoretically, the signal can be as large as the supply rails. If the design of the resistive circuit 21 uses an anti-parallel diode pair, the amplitude restriction is less critical than a diode pair at the signal input 12 because the voltage across the diodes is driven by the feedback capacitor 15 which can be made much larger than the capacitive sensor 14 (diode currents have less impact).

The voltage value of the amplified sensor signal SOUT is proportional to 1/CMEMS, which in case of a microphone sensor 14 is proportional to the sound pressure. No distortion from 1/x relationship between output voltage and measured quantity occurs. The gain is very accurate, because the process dependency is low. No small accurate capacitor is needed for gain accuracy.

The interface circuitry 49 and the MEMS microphone capacitive sensor 14 form the microphone component 50. The frequency band of interest is between about 20 Hz and 20 kHz. That means that the DC absolute signal is not of interest. The microphone component 50 achieves a low noise at low audio signals SAUD, together with low distortion up to very high audio signals SAUD.

In an alternative, not shown embodiment, the interface circuitry 49 comprises more than five pads. In an alternative, not shown embodiment, the microphone component 50 comprises more than three pins.

The invention claimed is:

1. A sensor arrangement, comprising:
   an amplifier having a signal input to receive an input signal and a signal output to provide an amplified sensor signal that is an inverted signal with respect to the input signal;
   a feedback path comprising a capacitive sensor and a feedback capacitor, wherein the capacitive sensor is connected to the signal input of the amplifier and to a feedback node and the feedback capacitor is connected to the feedback node and to the signal output of the amplifier;
   a biasing circuit which comprises an anti-parallel circuit of diodes, a biasing capacitor and a biasing amplifier having an input coupled to the signal output and an output coupled via the anti-parallel circuit of diodes to the signal input; and
   a voltage source arrangement that is connected to the feedback node between the capacitive sensor and the feedback capacitor,
   wherein the voltage source arrangement comprises a resistive circuit that comprises an anti-parallel circuit of diodes,
   wherein the voltage source arrangement comprises a voltage source that is implemented as a charge pump and is connected to the feedback node via the resistive circuit,
   wherein the biasing capacitor is coupled to the output of the biasing amplifier, and
   wherein the biasing amplifier is implemented as a transconductance amplifier.

2. The sensor arrangement according to claim 1, wherein the capacitive sensor is directly connected between the feedback node and the signal input of the amplifier.

3. The sensor arrangement according to claim 1, the capacitive sensor being realized as a microphone.

4. The sensor arrangement according to claim 1, the capacitance value of the feedback capacitor is larger than the capacitance value of the capacitive sensor.

5. The sensor arrangement according to claim 1, the voltage source arrangement coupling the signal output to the feedback node.

6. The sensor arrangement according to claim 1, comprising an attenuator coupling the signal output to the feedback capacitor.

7. The sensor arrangement according to claim 1, comprising a further capacitor coupling a further signal input of the amplifier to the feedback node.

8. The sensor arrangement according to claim 1, the amplifier comprising an input stage having a transistor that is realized as a field-effect transistor, wherein the signal input is connected to a control terminal of the transistor.

9. The sensor arrangement according to claim 1, the biasing circuit providing a biasing current that is an attenuated signal of the amplified sensor signal and is inverted with respect to the input signal.

10. A method for generating an amplified sensor signal, comprising:
    providing an input signal by a capacitive sensor to a signal input of an amplifier,
    generating an amplified sensor signal by the amplifier such that the amplified sensor signal is an inverted signal with respect to the input signal and is provided at a signal output of the amplifier,
    generating a feedback from the signal output to the signal input by the capacitive sensor and a feedback capacitor, wherein the capacitive sensor is connected to the signal input of the amplifier and to a feedback node and the feedback capacitor is connected to the feedback node and to the signal output of the amplifier; and
    charging the capacitive sensor by a voltage source arrangement that is connected to the feedback node between the capacitive sensor and the feedback capacitor,
    wherein a biasing circuit comprises an anti-parallel circuit of diodes, a biasing capacitor and a biasing amplifier having an input coupled to the signal output and an output coupled via the anti-parallel circuit of diodes to the signal input,
    wherein the voltage source arrangement comprises a resistive circuit that comprises an anti-parallel circuit of diodes,
    wherein the voltage source arrangement comprises a voltage source that is implemented as a charge pump and is connected to the feedback node via the resistive circuit,
    wherein the biasing capacitor is coupled to the output of the biasing amplifier, and
    wherein the biasing amplifier is implemented as a transconductance amplifier.

11. The method according to claim 10, wherein the capacitive sensor is directly connected between the feedback node and the signal input of the amplifier.

12. A sensor arrangement, comprising:
    an amplifier having a signal input and a signal output;
    a capacitive sensor and a feedback capacitor, wherein the capacitive sensor is connected to the signal input of the amplifier and to a feedback node and the feedback capacitor is connected to the feedback node and to the signal output of the amplifier;

a biasing circuit which comprises an anti-parallel circuit of diodes, a biasing capacitor and a biasing amplifier having an input coupled to the signal output and an output coupled via the anti-parallel circuit of diodes to the signal input; and a voltage source arrangement that couples the signal output of the amplifier to the feedback node and comprises a resistive circuit and a voltage source which is connected to the feedback node via the resistive circuit, wherein the resistive circuit comprises an anti-parallel circuit of diodes, wherein the biasing capacitor is coupled to the output of the biasing amplifier, and wherein the biasing amplifier is implemented as a transconductance amplifier.

13. A sensor arrangement, comprising:

an amplifier having a signal input to receive an input signal, a further signal input and a signal output to provide an amplified sensor signal that is an inverted signal with respect to the input signal;

a reference voltage source that is connected to the further signal input of the amplifier and to a reference potential terminal, wherein the reference voltage source provides a reference voltage that is supplied to the further input of the amplifier;

a feedback path comprising a capacitive sensor and a feedback capacitor, wherein the capacitive sensor is connected to the signal input of the amplifier and to a feedback node and the feedback capacitor is connected to the feedback node and to the signal output of the amplifier;

a biasing circuit which comprises an anti-parallel circuit of diodes that is coupled to the signal output of the amplifier and to the signal input of the amplifier; and a voltage source arrangement that is connected to the feedback node between the capacitive sensor and the feedback capacitor, wherein the voltage source arrangement comprises a resistive circuit, and wherein the voltage source arrangement comprises a voltage source that is implemented as a charge pump and is connected to the feedback node via the resistive circuit.

* * * * *